United States Patent [19]

Oshima et al.

[11] Patent Number: 4,623,908
[45] Date of Patent: Nov. 18, 1986

[54] THIN FILM TRANSISTORS

[75] Inventors: Hiroyuki Oshima; Toshimoto Kodaira; Toshihiko Mano, all of Suwa, Japan

[73] Assignee: Seiko Epson Kabushiki Kaisha, Tokyo, Japan

[21] Appl. No.: 481,087

[22] Filed: Mar. 31, 1983

[30] Foreign Application Priority Data

Apr. 1, 1982 [JP] Japan .................................. 57-54336
Apr. 15, 1982 [JP] Japan .................................. 57-63157

[51] Int. Cl.$^4$ .......................................... H01L 29/78
[52] U.S. Cl. .................. 357/23.7; 357/23.8; 357/59
[58] Field of Search .............. 357/4, 23 TF, 23 C, 357/23.6, 23.7, 23.8, 59; 307/304, 298, 571

[56] References Cited

U.S. PATENT DOCUMENTS

| | | | |
|---|---|---|---|
| 3,729,723 | 4/1973 | Yamamoto ........................... | 307/304 |
| 3,969,753 | 7/1976 | Thorsen, Jr. et al. ................ | 357/4 |
| 4,351,856 | 9/1982 | Matsui et al. ...................... | 357/59 X R |
| 4,455,566 | 6/1984 | Sakurai ............................. | 357/23 C |
| 4,533,934 | 8/1985 | Smith ............................... | 357/23.70 R |

OTHER PUBLICATIONS

"High Voltage SOS/MOS Devices ...", R. S. Ronen, M. R. Splinter, R. G. Tremain, Jr. IEEE Journal of Solid-State Circuits vol. 5611, No. 4, Aug. 1976, 431-442.

"Application of Laser Annealing Techniques ...", G. Yaron, L. D. Hess, Appl. Phys. Lett. 36(3), Feb. 1, 1980, 220-222.

"N-Channel Si-Gate MOS Devices on Sapphire Substrates", H. Tango, J. Iwamura, K. Maeguchi, M. Isobe, Proc. of the 6th Conference on Solid State Devices, Tokyo, 1974, Supplement to the Journal of Japan Society of Applic. Physics, vol. 44, 1975, 225-231.

Primary Examiner—Martin H. Edlow
Assistant Examiner—Sara W. Crane
Attorney, Agent, or Firm—Blum, Kaplan, Friedman, Silberman & Beran

[57] ABSTRACT

The thin film transistor comprises a plurality of individual thin film transistors on a common insulating substrate with the plurality of individual thin film transistors being connected together in series. The gate electrode of each individual transistor of the plurality of thin film transistors is connected to form one common gate electrode for the overall transistor. Leakage current in the OFF condition is substantially reduced. Identical performance is achieved from the transistor with interchangeability in designating source and drain terminals, when a symmetry is provided such that the i-th transistor in a series of N is physically identical to the (N−i+1)-th transistor in the overall transistor.

5 Claims, 19 Drawing Figures

FIG.1a
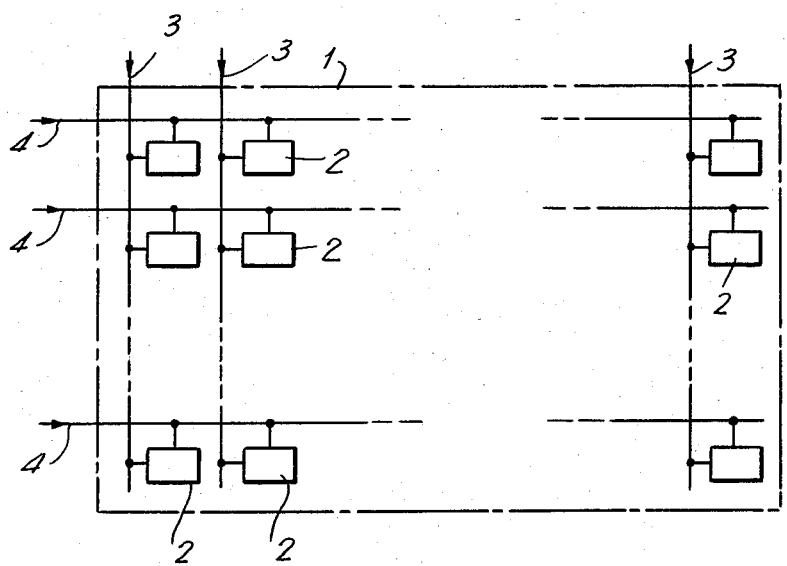
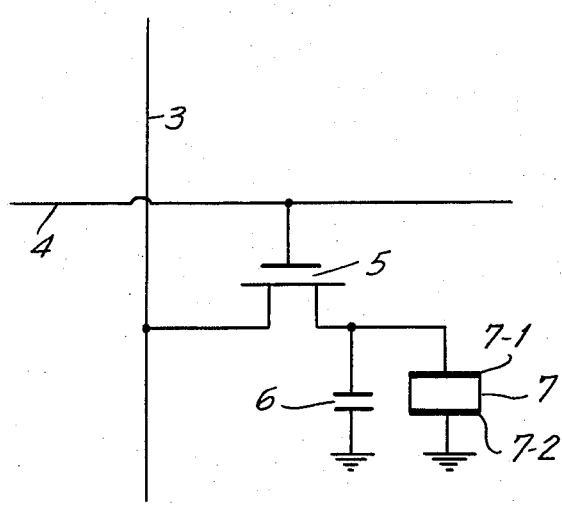
FIG.1b

THIN FILM TRANSISTORS

BACKGROUND OF THE INVENTION

This invention relates generally to a semi-conductor thin film transistor, and more particularly, to a semi-conductor thin film transistor having a construction wherein leakage current between source and drain regions is reduced in the OFF state. Recently, the techniques for forming thin film transistors have been studied with increasing intensity. The development of these transistors can be applied to many fields such as thin type active matrix display panels using a lower cost insulating substrate, three dimensional integrated circuits wherein an active element such as a transistor is formed on a semi-conductor integrated circuit, an inexpensive image sensor of high performance, high density memory devices, and the like. However, the performance of these devices is deteriorated when using thin film transistors because of the leakage current between source and drain which occurs in the OFF state. Thin film transistors capable of rapid response and delivering high current suffer the most from leakage currents in the OFF state.

What is needed is a thin film transistor (TFT) which has excellent forward characteristics and has low leakage current in the OFF state.

SUMMARY OF THE INVENTION

Generally speaking, in accordance with the invention, a thin film transistor especially suitable for applications which suffer in performance from leakage currents in the OFF state of the transistor, is provided. The thin film transistor comprises a plurality of individual thin film transistors on a common insulating substrate with the plurality of individual thin film transistors being connected together in series. The gate electrode of each individual transistor of the plurality of thin film transistors is connected to form one common gate electrode for the overall transistor. Leakage current in the OFF condition is substantially reduced. Identical performance is achieved from the transistor with interchangeability in designating source and drain terminals, when a symmetry is provided such that the i-th transistor in a series is physically identical to the $(N-i+1)$-th transistor in the overall transistor, wherein the number of individual transistors in series is N.

Accordingly, it is an object of this invention to provide an improved thin film transistor wherein the leakage current in the OFF condition is reduced without affecting the ON characteristics of the transistor.

Another object of this invention is to provide an improved thin film transistor wherein the source and drain may be connected interchangeably without change in leakage current in the OFF state.

A further object of this invention is to provide an improved thin film transistor wherein the leakage current in the OFF state does not increase even though negative voltage is increasingly applied to the gate.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention wil be indicated in the claims.

BRIEF DESCRIPTION OF THE DRAWINGS

For a fuller understanding of the invention, reference is had to the following description taken in connection with the accompanying drawings, in which:

FIGS. 1a, b, are typical circuits for applying thin film transistors to an active matrix panel;

DESCRIPTION OF THE PREFERRED EMBODIMENTS

Figure 2:
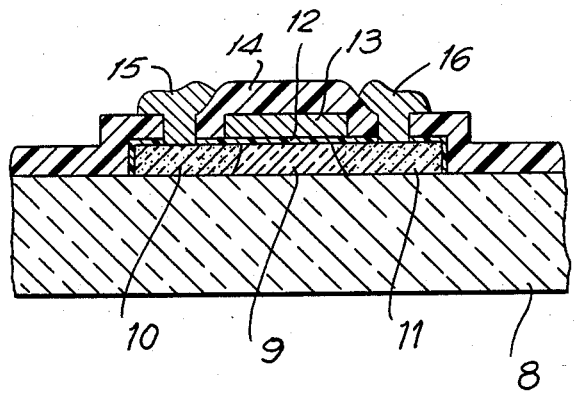
FIG. 2 is a sectional view of a N-channel thin film transistor using a semi-conductor thin film.

An active matrix display panel using thin film transistors (TFT) generally consists of an upper transparent substrate, a lower transparent substrate whereon TFT are formed, and liquid crystal material which is sealed between the two substrates. Liquid crystal driving elements associated with liquid crystal driving electrodes are arranged in a matrix on the TFT array. An external selecting circuit selects some of the liquid crystal driving elements for display and each associated liquid crystal driving electrode is excited to display selected letters, figures or pictures.

FIG. 1 is diagram of a arrangement of liquid crystal elements including TFT in an active matrix display panel. FIG. 1a illustrates an arrangement of liquid crystal driving elements 2 in a matrix on a lower substrate whereon thin film transistors are formed. Liquid crystal driving elements 2 are provided in a matrix pattern within a display area 1. Data signals and timing signals are applied to the liquid crystal driving elements 2 through input lines 3, 4, respectively.

FIG. 1b is a circuit diagram of a liquid crystal driving element 2, including a thin film transistor (TFT) for switching the data. A capacitor 6 is provided for storing data signals although such a capacitor 6 is not required physically if the capacitance of the liquid crystal material is sufficiently large. Also included is a liquid crystal cell 7 having a liquid crystal driving electrode 7-1 which is formed in correspondence to a liquid crystal driving element and an upper transparent panel 7-2. The thin film transistor 5 controls the application of data signals to the liquid crystal in the form of a voltage differential between substrates. In order to obtain high display performance, the thin film transistor is required to have the following characteristics:

(1) When the thin film transistor is in the ON state, the thin film transistor must be able to supply sufficient current to charge the capacitor 6.

(2) When the thin film transistor is in the OFF state, there must be little leakage current.

Requirement (1) is a necessary characteristic of a thin film transistor relating to the writing of data into a capacitor. Because the high quality of a liquid crystal display performance depends upon the voltage of the capacitor, the charge must be stored in the capacitor in a short period of time. In other words, a thin film transistor is desired to be capable of supplying sufficient current for writing data completely into a capacitor in a very short time. An amount of current flow for data writing, hereinafter referred to as ON current, is determined in accordance with the capacitance of the capacitor and the time necessary for writing data. Thus, a thin film transistor must be formed so as to supply sufficient ON current as determined by the capacitor. An amount of ON current flowing from a thin film transistor depends on many factors such as the structure and manufacturing process of the thin film transistor, the size of the thin film transistor, that is, channel length and/or channel width, the voltage applied to the gate or drain, and the like.

Requirement (2) is a necessary characteristic of a thin film transistor relating to the storage of the written data in the capacitor for a long time. In general, data once written into a capacitor should be maintained for a substantially longer time than the time which was required for writing the data. The capacitance of a capacitor as used in a matrix usually is small, approximately one pF. Therefore, the amount of charge stored in a capacitor is so small as to be easily affected by a small quantity of leakage current flowing between the source and drain regions of the transistor. In other words, if a leakage current occurs when the thin film transistor turns to the OFF state, hereinafter referred to as OFF current, the potential at the drain where the capacitor is coupled to the transistor rapidly becomes close to the potential at the source. As a result, the data written into a capacitor is not retained as it was.

Thus, it is significantly desirable to reduce leakage current between the source and drain regions, which current occurs when a thin film transistor is in the OFF state. It is difficult to reduce OFF current while attaining enough ON current. If the channel length is decreased and channel width is increased, the ON current in a thin film transistor rises but so does the OFF current. As OFF current causes the charge stored in the capacitor to discharge, the written data cannot be held in the capacitor for a long period of time.

Accordingly, reduction of the OFF current is a significant object for improvement of performance characteristics of a thin film transistor, even when the thin film transistor is applied in devices other than an active matrix panel. For example, when a thin film transistor is included in a logic circuit, OFF current in the thin film transistor causes an increase of undesirable current which flows when the circuit is not operated. If the thin film transistor is applied to a memory device or to an image sensor, operational errors are likely to occur because of the OFF current in the thin film transistor.

FIG. 2 is a sectional view of the structure of a conventional N-channel thin film transistor formed on an insulating substrate 8 made of glass or quartz, for example. The thin film transistor includes a semi-conductor thin film 9 such as polycrystalline silicon. A source region 10 is formed by doping an inpurity of phosphorous, arsenic, or the like into the semi-conductor thin film, and a drain region 11 is formed in the same manner as the source region 10. A gate electrode 13 is separated from the source and drain 10, 11 by a gate insulator 12 and by insulating film 14. Further, a source electrode 15 connects to the drain 10 and a drain electrode 16 connects to the drain 11.

Typical performance characteristics of a thin film transistor having a construction as shown in FIG. 2 are now described with reference to FIGS. 3 and 4 which are prepared as a result of experiments conducted by the applicants.

Figure 3:
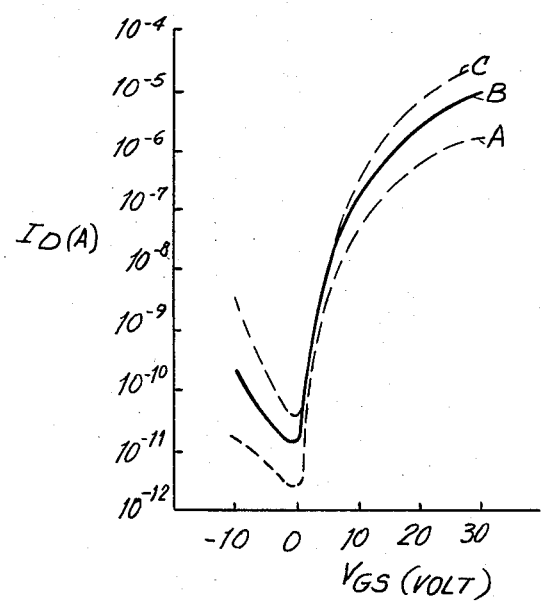
FIGS. 3 and 4 are graphs of the characteristics of a thin film transistor constructed in accordance with the prior art.

FIG. 3 is a graph showing characteristics of a thin film transistor in which channel length L is 20 microns and channel width W is 10 microns. The abscissa represents gate to source voltage $V_{GS}$ and the ordinate represents drain current $I_D$. The curves A, B, C, are for fixed drain to source voltages $V_{DS}$. In FIG. 3 the curves A, B and C correspond to characteristics when the drain to source voltage was 1, 4 and 8 volts, respectively. As is apparent from FIG. 3, the drain current $I_D$ drops to a minimum value around $V_{GS}=0$ volts and rises as the absolute value of $V_{GS}$ increases. Drain current $I_D$ is increased in the range where $V_{GS}$ is positive, when the thin film transistor turns from the OFF state to the ON state.

Therefore, a large-as-possible increasing rate of drain current when $V_{GS}$ is greater than zero is favorable. On the other hand, the increase of drain current in the negative region of $V_{GS}$ means that there is a dependency of OFF current on gate voltage. This dependency is an undesirable characteristic of a thin film transistor. Further, values of $I_D$ vary substantially depending on the drain voltage $V_{DS}$, especially in the negative regions of gate to source voltage. In other words, the OFF current is much more dependent on $V_{DS}$ than is the ON current.

Figure 4:
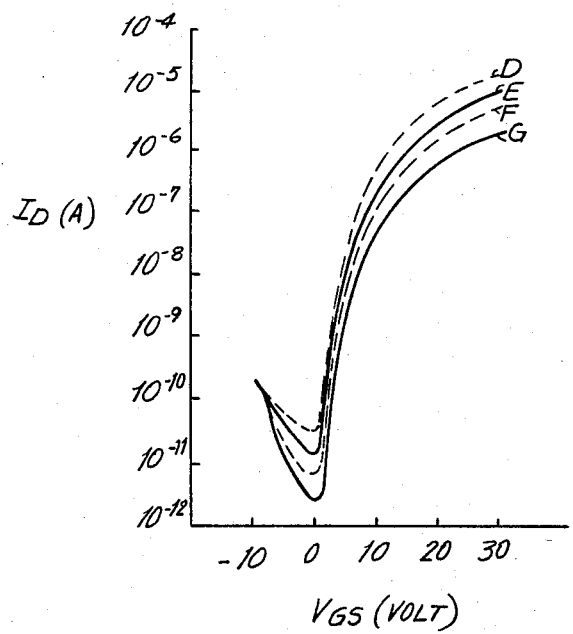

FIG. 4 illustrates the dependence of drain current $I_D$ on channel length, wherein the channel width W is 10 microns and the drain voltage $V_{DS}$ is constant at 4 volts. The variable parameter is length L. Curves D, E, F, and G correspond to the characteristics of a thin film transistor when length L is 10, 20, 40, and 100 microns, respectively.

As is apparent from FIG. 4, drain current $I_D$ is in inverse proportion to channel length L in the range when $V_{GS}$ is positive. This relationship between current and channel length is in accordance with the principle proven in a conventional metal oxide semiconductor field effect transistors.

In the range where the gate voltage $V_{GS}$ is negative, as the absolute value of $V_{GS}$ increases, drain current $I_D$ is less and less dependent on channel length. Finally, when $V_{GS}$ is less than, that is, more negative than approximately $-8$ volts, the value of drain current, that is, OFF current, is the same regardless of channel length.

In view of the graphs of FIGS. 3 and 4, it will now be described how OFF current occurs. When $V_{GS}$ equals zero volts, OFF current is determined by the inherent resistance of the semiconductor thin film. In general, when a reverse bias voltage, that is, a negative value of $V_{GS}$, is applied to the gate, the amount of OFF current flow is strictly limited by the PN junction barrier formed between the N-type layers of the source and drain and the P-type accummulation region induced at the surface of the semiconductor. However, leakage current tends to flow easily at such PN junctions in the case of polycrystalline silicon because many trapping levels in the depletion layer are yielded by the property of grain boundaries in polycrystalline silicon. Furthermore, when the reversed bias voltage is increased, the carrier density in the accummulation region increases and the depletion layer at the PN junction narrows by this increased carrier density. This phenomenon is the main reason why leakage current flows more readily as reversed bias voltage is increased.

The dependence of OFF current on drain voltage is explained in the same manner as above. At the zero bias voltage of the gate, it is understood that the dependence of leakage current on channel length comes from the inherent bulk resistivity of the thin film transistor as explained above. However, this dependence of leakage current on channel length comes to be negligibly small as reverse bias voltage increases because the presence of leakage current at the PN junction is increased, as described above.

Heretofore, few suggestions for reducing OFF current have been offered and there has been no really effective means to cut down OFF current especially when gate voltage is biased in a reverse direction. This is so because it is very difficult to cut down the leakage current which flows across the junction.

An object of this invention is to provide a greatly improved thin film transistor in which OFF current does not increase even though negative voltage is increasingly applied to the gate. The thin film transistor in accordance with the invention is characterized by a construction wherein plural thin film transistors are connected in series and the opposite extreme ends of the series are defined as the source electrode and the drain electrode respectively. Moreover, one common gate electrode is provided for the series of thin film transistors. The thin film transistor in accordance with the invention is described in detail with reference to the accompanying drawings.

Figure 5:
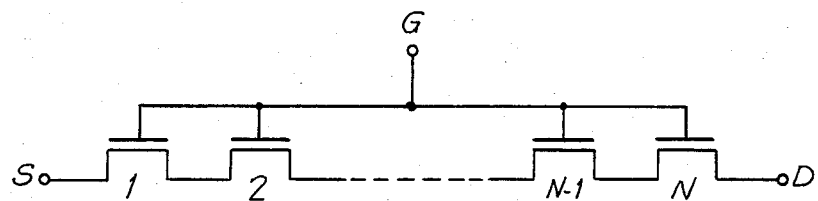
FIG. 5 is a circuit of a thin film transistor in accordance with the invention.

FIG. 5 is a thin film transistor in accordance with the invention wherein the source terminal is S, the drain terminal is D and gate terminal is G. N represents the number of individual thin film transistors which are connected in series. As shown by FIG. 5, as many as N thin film transistors are connected in series and one of the extreme ends of the series is the source and the other extreme end of the series is the drain. The gates of each thin film transistor are connected together to form one common gate. Such a thin film transistor (FIG. 5) has excellent characteristics as explained below.

Figure 6A:
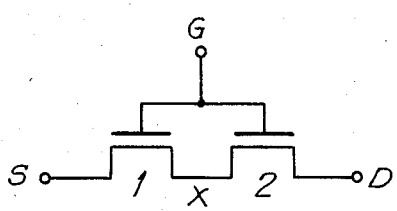
FIGS. 6a, b are circuit diagrams of one embodiment of a thin film transistor in accordance with the invention showing details and an equivalent circuit, respectively.

FIG. 6a is a circuit diagram of a thin film transistor of FIG. 5 when N equals 2. In FIG. 6, S, D, and G represent source, drain and gate respectively as in FIG. 5. $V_S$, $V_D$, $V_G$, and $V_X$ respectively stand for the voltage levels at the points S, D, G and the point X illustrated between the thin film transistors numbered 1 and 2, respectively. L1 and L2 are the channel lengths of the corresponding individual thin film transistors.

Figure 6B:
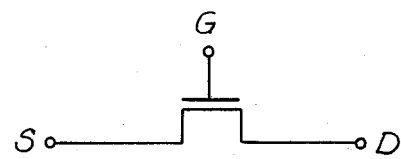

FIG. 6b is an equivalent circuit of FIG. 6a wherein one TFT is shown to represent the two TFTs in series of FIG. 6a. The channel length in FIG. 6b is L1+L2. The drain voltage $V_{DS1}$ and the gate voltage $V_{GS1}$ of the transistor 1, and the drain voltage $V_{DS2}$ and the gate voltage $V_{GS2}$ of the transistor 2 are obtained by the following equations.

$$V_{DS1} = V_X - V_S$$

$$V_{GS1} = V_G - V_S$$

$$V_{DS2} = V_D - V_X$$

$$V_{GS2} = V_G - V_X$$

The potential $V_X$ at point X is determined so that current I1 flowing through the transistor 1 is equal to the current I2 flowing through the transistor 2. Comparison of the voltage potential at the points S, X and D indicates that $V_S < V_X < V_D$. When voltage $V_G - V_S > 0$, the voltage $V_D - V_S$ is divided and the divided voltage is applied to the two transistors respectively, which induces a reduction in drain current. However, as drain current depends on channel length, the drain current increases to the degree that the channel length is less than that of FIG. 6b. As a result, the current values for the transistor in FIG. 6a are equal to the current values for the transistor in FIG. 6b. Thus, the current value for the ON current does not change even when the channel length is divided into many parts.

To the contrary, where the voltage $V_G - V_S < 0$, it does not always follow that drain current increases as channel length decreases. As illustrated in FIG. 4, the dependence of drain current on channel length is gradually lost when the gate is biased in the reverse direction. Namely, as the gate voltage is made increasingly negative, the OFF current depends less and less on the channel length until no effect is produced on the OFF current by the difference of channel length between the TFT of FIG. 6a and that of FIG. 6b. Accordingly, as drain voltage applied to each transistor is reduced, the OFF current is reduced in the construction of FIG. 6b. This effect becomes increasingly apparent as increasing reverse voltage is applied to the gate.

The foregoing can be explained in solid state theory as follows. In the ON state of the transistor, the gradient of potential (electric field) is almost uniform from source to drain because a channel is formed on the surface of the semi-conductor thin film. Therefore, the drain current does not change regardless of how the channel is divided. To the contrary, in the OFF state of the transistor, a greater part of the electrical field is concentrated at the PN junction around the drain as described above. Use of a plurality of transistors connected in series to act as one transistor prevents the electric field from being intensely concentrated on the one PN junction near the drain, because the electric field is distributed to each PN junction of the plurality of individual transistors. Thus, the electric field at each PN junction is weaker and leakage current flowing across the junction can be cut off.

Figure 7:
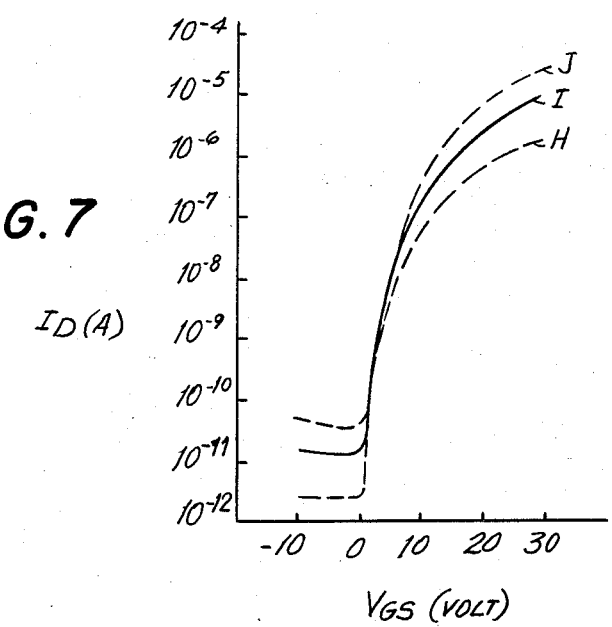
FIG. 7 is a graph of the operating characteristics of the thin film transistor of FIG. 6.

FIG. 7 illustrates the characteristics of a thin film transistor in accordance with the invention, which is comprised of two transistors in series. FIG. 7 illustrates characteristics of a transistor as in FIG. 6a where L1=L2=10 microns and W1=W2=10 microns. Thus, the transistor of FIG. 7 is equivalent to the transistor in FIG. 3. The data of FIG. 7 was experimentally obtained by the inventors. The invariable parameter is drain voltage and curve H represents transistor characteristic when $V_{DS}=1$ volt; the curve I represents the condition $V_{DS}=4$ volts and curve J is at $V_{DS}=8$ volts.

As the graph (FIG. 7) illustrates, the curve of ON current in the range where $V_{GS}$ is positive, substantially corresponds to that of FIG. 3. On the other hand, the curves of OFF current in the range where $V_{GS}$ is negative, differ substantially from that of FIG. 3. In particular, the OFF current is fixed at the low values in FIG. 7. Thus, in accordance with the invention, the OFF current is substantially decreased while maintaining the same quantity of ON current as supplied by a conventional thin film transistor. Further, when calculating the OFF characteristic of a TFT in accordance with this invention by performing computer simulations based on a conventional transistor characteristic, the calculated data substantially agreed with the characteristics shown in the graph of FIG. 7.

This invention is applicable to an overall thin film transistor using not only two TFTs (N=2) but also when more than three TFTs (N≧3) are connected in series. With increasing numbers of TFTs in series, the OFF current is greatly decreased when the drain voltage is high because the drain voltage applied to each transistor decreases proportionately as the number of transistors increases. Therefore, the number (N) of transistors can be selected in accordance with the application of the thin film transistor and the level of OFF current required. If applying a transistor in accordance with the invention to an active matrix panel, two or three transistors in series to represent a single equivalent transistor performs satisfactorily because drain voltage is generally low, less than approximately 10 volts. If using a thin film transistor for a logic circuit, a large number of thin film transistors connected in series to represent a single TFT is desirable to decrease the OFF current, because high gate voltage is applied to obtain sufficient ON current generally and drain voltage is as high as the gate voltage.

As stated above, excellent results can be obtained when applying this invention to a logic circuit. A description of such a circuit follows.

Figure 8A:
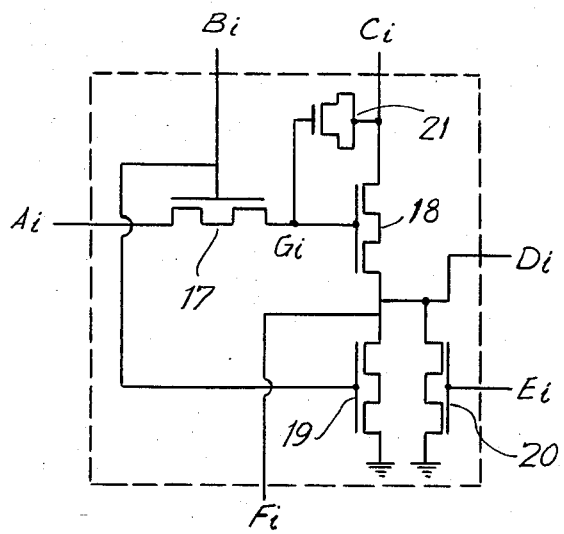
FIGS. 8a, b, c and FIGS. 9a, b, c are different shift register logic circuits using thin film transistors in accordance with the invention.

FIGS. 8a, b, c, illustrate an embodiment in accordance with the invention, wherein a circuit constructed in accordance with the invention is used for a logic circuit such as a shift register. In FIG. 8, N equals 2 although it should be understood that the value of N may be another number.

FIG. 8a is a basic circuit diagram of a bootstrap effect shift register corresponding to one bit on the i-th stage. In this diagram, the transistors are N-channel transistors. A read-in TFT 17 is turned on by clock signals inputted to a terminal Bi which connects to the transistor gate. When the clock signal is at the high level, the read-in TFT 17 transmits data from the preceding stage, that is, the (i−1)-th stage. The channel of a MOS capacitor 21 is inverted only when data at a node Gi is at a level 1, that is, high, and the MOS capacitor operates as a bootstrap capacitor. When a low level clock signal is inputted to the terminal Bi and a high level clock signal is inputted to the terminal Ci, the potential at the node Gi overshoots beyond the high level of clock signal which is to be transmitted to the node Gi. Consequently, a bootstrap TFT 18 easily goes as to the ON state by receiving a very high level signal from the node Gi. Thus, the potential at the output terminal Di rapidly reaches the high level.

Conversely, when a high level clock signal is inputted to the terminal Bi and a low level clock signal is inputted to the terminal Ci, a TFT 19 goes to the ON state and the potential at the output terminals Di and Fi go to the low level. At the same time, data is transmitted to the node Di+1 and a potential at the node Di+1 goes to the high level.

The terminal Ei−1 is connected to the terminal Di+1. When the potential at the terminal Di is low, the charge stored at the node Di is discharged through the TFT 17 of the i-th stage and the TFT 20 of the preceding stage (i−1)-th stage. Thus, the potential at the node Gi goes low.

Figure 8B:
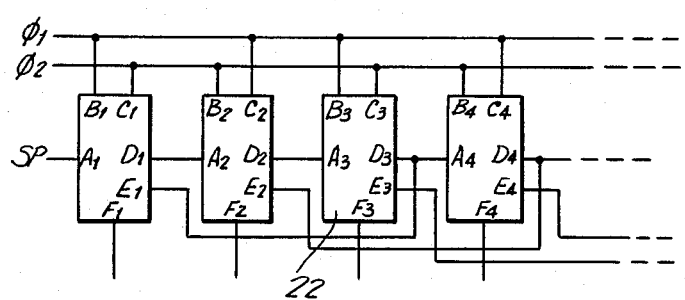
Figure 8C:
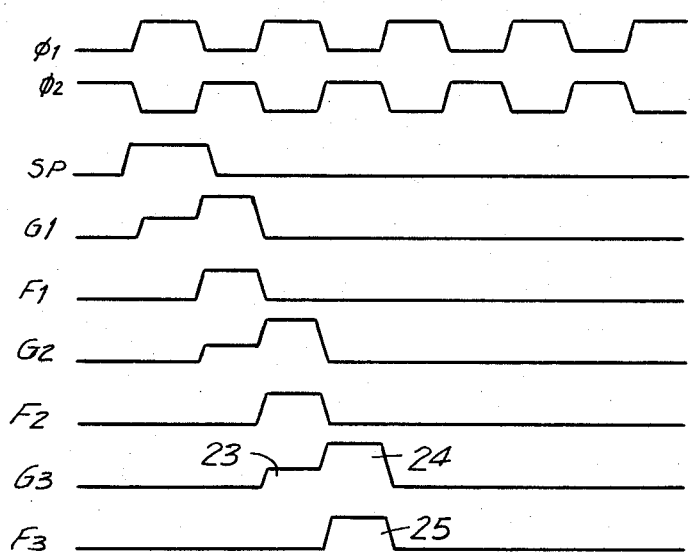

FIG. 8b is a circuit diagram of a shift register comprised of the above described basic circuits. FIG. 8c is a timing chart of signals utilized in the circuit of FIG. 8b. In FIG. 8c, $\phi 1$ and $\phi 2$ are clock signals of opposite phase, SP is a starting pulse, and G1, F1, G2, F2, G3 and F3 are signals passing through the corresponding points referred to by the same letter in FIGS. 8a and FIG. 8b, respectively.

The following description refers to a cell 22 which is the third stage in FIG. 8b. As described above, the OFF current of TFT 17 is substantially reduced in accordance with the construction of this invention. Therefore, when data 1 is transmitted to the node G3, receiving a signal as shown at 23 in FIG. 8c, the potential at the node G3 overshoots as shown at 24 in FIG. 8c beyond the high level of the clock signal $\phi 2$ simultaneously with the rise in the clock signal $\phi 2$. The high potential at the node G3 is maintained until the clock signal $\phi 2$ falls. Consequently, the potential at the output terminal F3 rapidly goes high as the level of the clock signal $\phi 2$. That is indicated at 25 in FIG. 8c.

As stated above, a shift register utilizing TFT in accordance with this invention can operate properly with higher operating frequencies than is usually achieved. Also, the output amplitude from the shift register is large. Furthermore, according to this invention, OFF current in the bootstrap TFT 18, which occurs as drain voltage increases, is remarkably reduced and output of an error pulse can be prevented. As a result, the shift register can also operate properly with lower operating frequencies than is conventional.

Figure 9A:
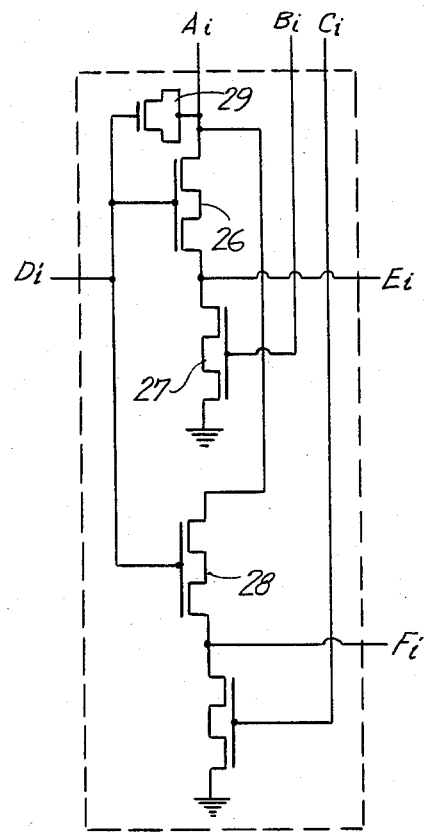
Figure 9B:
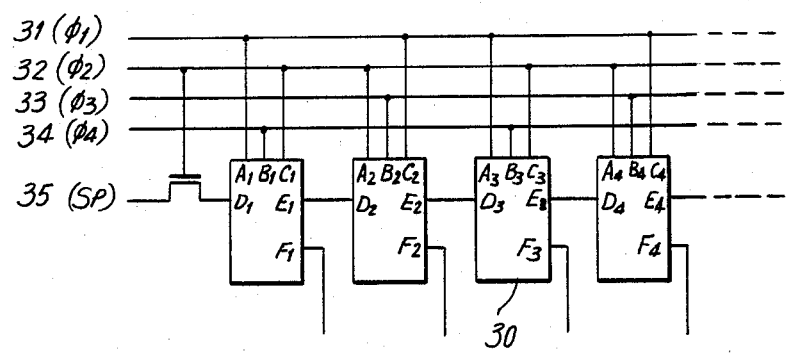
Figure 9C:
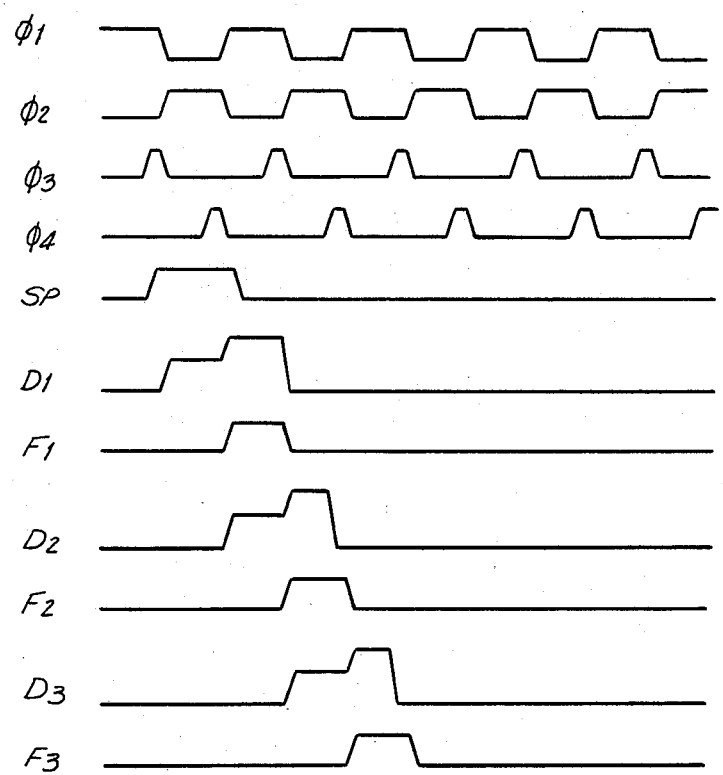

FIGS. 9a–c illustrate an alternative embodiment of circuits using thin film transistors in accordance with the invention. FIG. 9a illustrates basic circuits corresonding to one bit of a bootstrap effect shift register on the ith stage. The shift register comprises a plurality of basic circuits of FIG. 9a which are cascade-connected as shown in FIG. 9b. As shown in FIG. 9c, clock signals $\phi 1$, $\phi 2$, $\phi 3$, $\phi 4$, as shown in FIG. 9c, and data signal SP are applied to the terminals 31, 32, 33, 34 and 35, respectively. Using the shift register cell 30 on the third stage of FIG. 9b as an example, operation of the thin film transistors is particularly described as follows.

When a data 1 is inputted at the node D3 while the clock signal $\phi 1$ is low, the surface of the substrate of the thin film MOS capacitor 29 is inverted to obtain a large capacitor. As soon as the clock signal $\phi 1$ go from a low level to a high level, the potential at D3 overshoots beyond the high level of the clock signal $\phi 1$ due to the bootstrap effect of the capacitor 29. Then, thin film bootstrap transistors 26, 28 are made conductive. With switching on of bootstrap TFT's 26, 28, the capacitor of the next cell (added) at the node E3 and output terminal F3 is charged rapidly, so that the potential at D3 and F3 rises to the high level of the clock signal. At that moment the substrate of the thin film MOS capacitor 29 of the shift register cell on the fourth stage is inverted. The clock signal $\phi 3$ comes to a high level a short time immediately before the clock signal $\phi 1$ falls from the high level to the low level, switching on discharge TFT 27 in the second stage cell and the charge stored at the node D3 is discharged through discharge TFT 27 and the potential at Ei falls to the low level thereby. The potential at the output terminal F3 falls simultaneously with the drop in the clock signal φ1 from high level to low level and with the rise of the clock signal φ2 from the low level to the high level.

FIG. 9c illustrates the waveforms of the signals at the different components of the circuit. As stated above, in accordance with the invention, it is possible to maintain a high potential using TFT, because OFF leakage current of bootstrap TFT 26 and discharge TFT 27 in the (i−1)-th stage is reduced to keep a stable potential at the node D1, when the potential at the node Di overshoots. Further, by reducing the OFF current of readout TFT 28, it is possible to prevent an error pulse from being generated at the output terminal Di.

As illustrated in FIGS. 8 and 9 a logic circuit using TFTs in accordance with the invention, is obtained having a broader range of maximum operating frequency and a stable value of output amplitude signal. As stated above, in accordance with the invention, a remarkably improved TFT is obtained wherein OFF current is greatly reduced without decreasing ON current.

An alternative embodiment of a thin film transistor in accordance with the invention is described hereinafter. In the following description, reference is made to Figures which have been discussed above and are equally applicable to both embodiments with the understanding that parameters have been modified in this alternative embodiment as described below.

An object of this alternative embodiment in accordance with the invention is to provide a greatly improved thin film transistor having a characteristic that the OFF current barely increases even when the gate is biased in the reverse direction, that is, by reducing the dependence of OFF current on gate voltage. In accordance with the alternative embodiment, N pieces of thin film transistors using a thin film of semiconductor material, and respectively having a source electrode, drain electrode and gate electrode, are connected in series (N≧2) to be one overall transistor. The electrodes at both ends of the connected transistors are made to be the source and drain electrodes respectively of the overall transistor and the gate electrodes of the N pieces of TFTs are joined in common. The size of the i-th TFT from the source electrode side or drain electrode side is equal to that of the (N−i+1)-th TFT from the same side (i=1, 2, ... N). The alternative embodiment in accordance with the invention is described in detail referring to the drawings as follows.

FIG. 5 is a schematic diagram of one alternative embodiment in accordance with the invention, wherein S, D, and G designate source, drain and gate respectively. N is an integer greater than 2 which designates the number of individual thin film transistors connected in series to form one overall thin film transistor. Each individual thin film transistor is given a reference numeral from the source side. The gates of N pieces of thin film transistor are made to form one gate.

Further, the size of the i-th TFT, that is, channel length L and channel width W, is equal to the size of the (N−i+1)-th TFT (i=1, 2 ... N). In other words, the first transistor and the N-th transistor are the same in size and the second transistor and the (N−1)-th transistor are similarly the same size. This relationship is the same with respect to the remainder of the individual transistors within the overall transistor. The relationship is formularized as:

$$L_i = L_{N-i+1}$$

$$W_i = W_{N-i+1}$$

Wherein Li and Wi are channel length and channel width of the i-th transistor respectively. The object of this invention is to provide a thin film transistor of excellent characteristics by a construction wherein a plurality of individual transistors are arranged as stated above to form one overall transistor. The basis for this construction is described with reference to FIG. 6.

FIG. 6a is a circuit diagram in a construction where N=2 in FIG. 5. In order simplify the explanation, this invention is explained by using a construction of N=2 as an example. S, D and G designate source, drain and gate, respectively. $V_S$, $V_D$, $V_G$ and $V_X$ designate the voltage potential at points S, D, G and X, respectively. Reference numerals have been assigned to the two individual thin film transistors. Each transistor has the same channel length L and the same channel width W. FIG. 6b is an equivalent circuit of the transistors of FIG. 6a, wherein channel length is 2L and channel width is W.

The drain voltage $V_{DS1}$ and the gate voltage $V_{GS1}$ of the transistor 1, and the drain voltage $V_{DS2}$ and the gate voltage $V_{GS2}$ of the transistor 2 are obtained by the following equations.

$$V_{DS1} = V_X - V_S$$

$$V_{GS1} = V_G - V_S$$

$$V_{DS2} = V_D - V_X$$

$$V_{GS2} = V_G - V_V$$

The potential $V_X$ at point X is determined so that current I1 flowing through the transistor 1 is equal to the current I2 flowing through the transistor 2. Comparison of the voltage potential at the points S, X and D indicates that $V_S < V_X < V_D$. When voltage $V_G - V_S > 0$, the voltage $V_D - V_S$ is divided and the divided voltage is applied to the two transistors respectively, which induces a reduction in drain current. However, as drain current depends on channel length, the drain current increases to the degree that the channel length is less than that of FIG. 6b. As a result, the current values for the transistor in FIG. 6a are equal to the current values for the transistor in FIG. 6b. Thus, the current value for the ON current does not change even when the channel length is divided into many parts.

To the contrary, where the voltage $V_G - V_S < 0$, it does not always follow that drain current increases as channel length decreases. As illustrated in FIG. 4, the dependence of drain current on channel length is gradually lost when the gate is biased in the reverse direction. Namely, as the gate voltage is made increasingly negative, the OFF current depends less and less on the channel length until no effect is produced on the OFF current by the difference of channel length between the TFT of FIG. 6a and that of FIG. 6b. Accordingly, as drain voltage applied to each transistor is reduced, the OFF current is reduced in the construction of FIG. 6b. This effect becomes increasingly apparent as increasing reverse voltage is applied to the gate.

The foregoing can be explained in solid state theory as follows. In the ON state of the transistor, the gradient of potential (electric field) is almost uniform from source to drain because a channel formed on the surface of the semi-conductor thin film. Therefore, the drain current does not change regardless of how the channel is divided. To the contrary, in the OFF state of the transistor, a greater part of the electrical field is concentrated at the PN junction around the drain as described above. Use of a plurality of transistors connected in series to act as one transistor prevents the electric field from being intensely concentrated on the one PN junction near the drain, because the electric field is distributed to each PN junction of the plurality of individual transistors. Thus, the electric field at each PN junction is weaker and leakage current flowing across the junction can be cut off.

Next, the effect that the form of the i-th transistor is made equal to that of the (N−i+1)-th transistor, that is, in (FIG. 6) the form of the two transistors is made the same as described below. Generally, source and drain are symmetrical in a field effect transistor which is one of the important characteristics. Namely, the characteristics of the transistor do not change even if the source and drain are interchanged. This characteristic allows the transistor to be applied for devices such as switching elements of an active matrix panel, wherein the source and drain of the transistor are interchanged at every moment.

In this case of series elements, the characteristic of the transistor, especially the relationship between gate voltage and drain current in the OFF-state, that is, the OFF characteristic, is varied by interchanging source and drain, and a variation of characteristics of each transistor is thereby caused. This invites a further deterioration of performance of a total system. Accordingly, the transistor characteristic is required to be constant even when source and drain are interchanged. To satisfy this requirement, in accordance with the invention, the i-th transistor is made equal to the (N−i+1)-th transistor in form.

A construction wherein the size is the same of the i-th and the (N−i+1)-th transistors permits the source and drain to be arranged symmetrically with respect to the gate in an overall transistor. Consequently, the transistor characteristic does not change even if the source and drain are interchanged.

FIG. 7 illustrates the characteristics of a thin film transistor in accordance with the invention, which is comprised of two transistors in series. FIG. 7 illustrates characteristics of a transistor as in FIG. 6a where L1=L2=10 microns and W1=W2=10 microns. Thus, the transistor of FIG. 7 is equivalent to the transistor in FIG. 3. The data of FIG. 7 was experimentally obtained by the inventors. The variable parameter is drain voltage and curve H represents transistor characteristic when $V_{DS}=1$ volt; the curve I represents the condition $V_{DS}=4$ volts and curve J is at $V_{DS}=8$ volts.

As the graph (FIG. 7) illustrates, the curve of ON current in the range where $V_{GS}$ is positive, substantially corresponds to that of FIG. 3. On the other hand, the curves of OFF current in the range where $V_{GS}$ is negative, differs substantially from that of FIG. 3. In particular, the OFF current is fixed at the low values in FIG. 7. Thus, in accordance with the invention, the OFF current is substantially decreased while maintaining the same quantity of ON current as supplied by a conventional thin film transistor. Further, when calculating the OFF characteristic of a TFT in accordance with this invention by performing computer simulations based on a conventional transistor characteristic, the calculated data substantially agreed with the characteristics shown in the graph of FIG. 7.

This invention is applicable to an overall thin film transistor using not only two TFTs (N=2) but also when more than three TFTs (N≧3) are connected in series. With increasing numbers of TFTs in series, the OFF current is greatly decreased when the drain voltage is high because the drain voltage applied to each transistor decreases proportionally as the number of transistors increases. Therefore, the number (N) of transistors can be selected in accordance with the application of the thin film transistor and the level of OFF current required. If applying a transistor in accordance with the invention to an active matrix panel, two or three transistors in series to represent a single equivalent transistor performs satisfactorily because drain voltage is generally low, less than approximately 10 volts. If using a thin film transistor for a logic circuit, a large number of thin film transistors connected in series to represent a single TFT is desirable to decrease the OFF current, because high gate voltage is applied to obtain sufficient ON current generally and drain voltage is as high as the gate voltage.

Figure 10A:
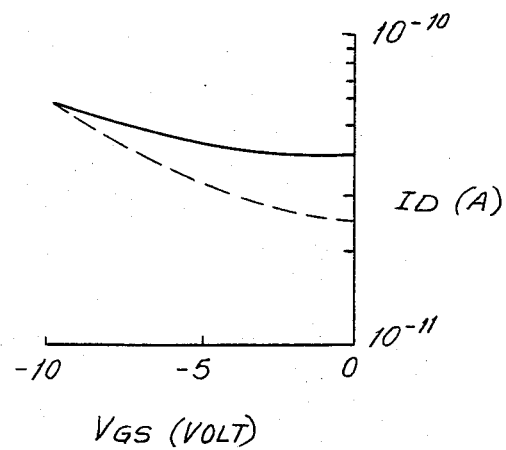
FIGS. 10a, b are graphs illustrating the effect on a thin film transistor in accordance with the invention when two individual thin film transistors having different constructions are connected in series.
Figure 10B:
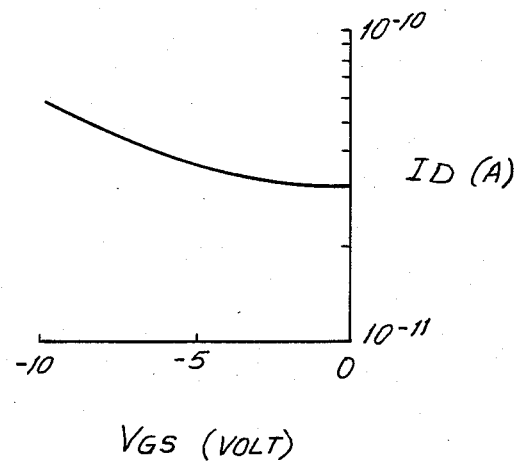

FIG. 10 presents graphs illustrating OFF characteristics for an overall transistor of FIG. 6a when variously changing the size of two thin film transistors. FIG. 10a shows the OFF characteristic when the channel length L1 is 5 microns and the channel width W1 is 10 microns in the transistor 1, and the channel length L2 is 15 microns and the channel width W2 is 10 microns in the transistor 2. FIG. 10b shows the OFF characteristics when the transistors 1 and 2 are equal in form, namely, L1=L2=10 microns and W1=W2=10 microns. The solid line in the graph shows the OFF characteristics in a case where source and drain are positioned as shown in FIG. 6a. The broken line in the graph shows the OFF characteristic in a case where the positions of source and drain are reversed. As shown in FIG. 10a, when the size, that is, channel length in this example, of the two transistors is different, the transistor characteristic is markedly changed by interchanging source and drain.

On the other hand, as shown in FIG. 10b, when the form of the two transistors is the same, the overall transistor characteristic is not changed at all by interchanging source and drain and the two curves, solid and broken line, coincide with each other perfectly. This data presents the effect in accordance with this invention with respect to channel length as the variable parameter in a construction using two transistors in an overall transistor. With regard to the channel width as a variable, the like effect (not shown) of this invention can be proven in a similar manner.

Figure 11A:
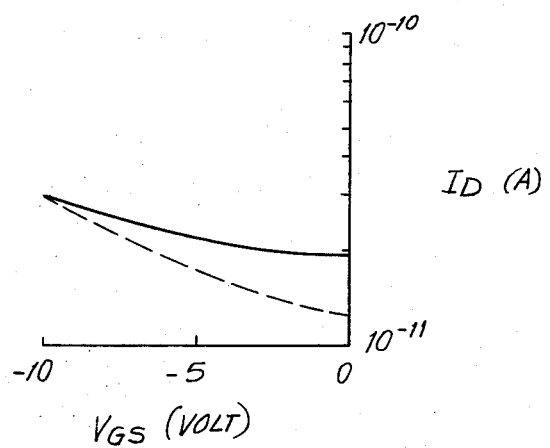
FIGS. 11a, b, are graphs similar to FIGS. 10a, b showing the effect when three thin film transistors of different constructions are connected in series.
Figure 11B:
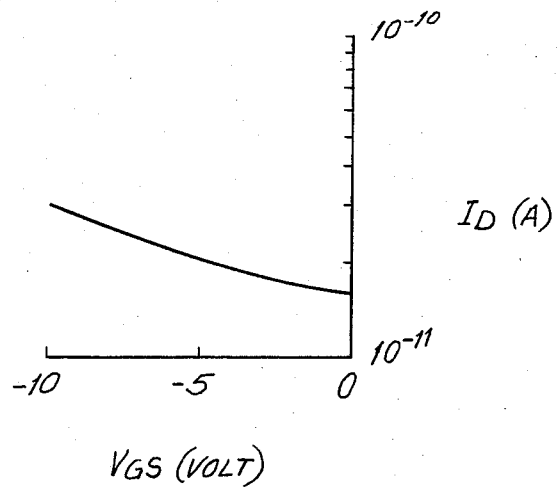

FIGS. 11a, b show the overall transistor characteristics when varying the size of each individual transistor in a construction where three thin film transistors are connected in series. FIG. 11a shows OFF characteristics when the channel length L1 is 5 microns and the channel width W1 is 10 microns in the transistor 1. The channel length L2 is 20 microns and the channel width W2 is 10 microns in the transistor 2, and the channel length L3 is 15 microns and the channel width W3 is 10 microns in the transistor 3. FIG. 11b shows the OFF characteristic when L1 is 10 microns and W1 is 10 microns in the transistor 1. L2 is 20 microns and W2 is 10 microns in the transistor 2 and L3 is 10 microns and W3 is 10 microns in the transistor 3. The solid line curve of FIG. 11a represents OFF characteristics when the source and drain are optionally selected and the broken line represents the OFF characteristic when the source and drain are interchanged. As illustrated in FIG. 11a, the transistor characteristic changes substantially by interchanging source and drain when the size, that is, channel length in the case, of transistors 1 and 3 is different.

On the other hand, as shown in FIG. 11b, when the size of the transistors 1 and 3 is the same, the transistor characteristic is not changed at all by interchanging source and drain regardless of the size of transistor 2. The two curves, that is, the solid line and the broken line coincide with each other precisely. The result is the same when the size of the three transistors is the same. These data exhibit the effect of this invention with respect to the channel length in a construction of three individual transistors in an overall transistor. With regard to channel width the same effect (not shown) can be demonstrated in the same manner.

In the embodiments described herein, as illustrated in FIGS. 10 and 11, two or three transistors connected in series have been utilized to allow the form of the i-th transistor to be the same as that of the (N−i+1)-th transistor. It is clear that the invention is applicable to four or more transistors connected in series to form an overall transistor.

As stated above, in accordance with this invention, very substantially improved thin film transistors are provided which have excellent characteristics in that OFF current is markedly reduced without reducing the ON current and the transistor characteristic does not change even source and drain are interchanged.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A low-leakage thin film transistor comprising:
an insulating substrate comprising a material from the group consisting of glass quartz;
a plurality of thin film transistors formed of non-monocrystalline silicon on the insulating substrate, the source-drain paths of the thin film transistors being connected in series to provide one source electrode and one drain electrode, the gate electrodes of the thin film transistors being connected to form one common date electrode wherein the leakage current of the thin film transistor does not substantially increase when negative voltage is increasingly applied to the gate.

2. A thin film transistor as claimed in claim 1, wherein the number of interconnected thin film transistors is N, N being greater than or equal to 2, and wherein the i-th thin film transistor, counting from either the source electrode or the drain electrode, is of the same physical construction as the (N−i+1)th counting in series from the same side, where i=1, 2 ... N.

3. A thin film transistor in accordance with claim 1 wherein the material of the plurality of transistors comprises polycrystalline silicon.

4. A low-leakage thin film transistor comprising;
an insulating substrate;
a plurality of thin film polycrystalline silicon transistors on the insulating substrate, the source-drain paths of the plurality of thin film transistors connected in series to provide one source electrode and one drain electrode, the gate electrodes of the plurality of thin film transistors being connected to form one common gate electrode, wherein the leakage current of the thin film transistor does not substantially increase when negative voltage is increasingly applied to the gate.

5. The thin film transistor of claim 4, wherein the number of interconnected thin film transistors is N, N being greater than or equal to 2, and wherein the i-th thin film transistor, counting from either the source electrode or the drain electrode is of the same physical construction as the (N−i+1)th thin film transistor, counting in series from the same electrode, where i=1,2 ... N.

* * * * *